US008956973B2

(12) United States Patent
Farooq et al.

(10) Patent No.: US 8,956,973 B2
(45) Date of Patent: Feb. 17, 2015

(54) BOTTOM-UP PLATING OF THROUGH-SUBSTRATE VIAS

(75) Inventors: Mukta G. Farooq, Hopewell Junction, NY (US); John A. Fitzsimmons, Hopewell Junction, NY (US); Troy L. Graves-Abe, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 13/431,343

(22) Filed: Mar. 27, 2012

(65) Prior Publication Data

US 2013/0260556 A1    Oct. 3, 2013

(51) Int. Cl.
    *H01L 21/44* (2006.01)
(52) U.S. Cl.
    USPC ............... 438/667; 257/698; 257/E21.174
(58) Field of Classification Search
    USPC .......................... 438/667; 257/621
    See application file for complete search history.

(56) References Cited

U.S. PATENT DOCUMENTS

| 6,414,506 | B2 * | 7/2002 | Akram et al. ............ 324/756.02 |
| 6,878,608 | B2 | 4/2005 | Brofman et al. |
| 6,962,867 | B2 | 11/2005 | Jackson et al. |
| 7,101,792 | B2 | 9/2006 | Kirby et al. |
| 7,226,812 | B2 | 6/2007 | Lu et al. |
| 7,253,492 | B2 | 8/2007 | Ma et al. |
| 7,701,039 | B2 | 4/2010 | Kirby et al. |
| 7,883,938 | B2 | 2/2011 | Kolan et al. |
| 7,935,571 | B2 | 5/2011 | Ramiah et al. |
| 7,944,043 | B1 * | 5/2011 | Chung et al. ............ 257/698 |
| 8,003,532 | B2 | 8/2011 | Hua et al. |
| 8,791,009 | B2 | 7/2014 | Farooq et al. |
| 2005/0077630 | A1 * | 4/2005 | Kirby et al. ............ 257/774 |
| 2008/0164573 | A1 * | 7/2008 | Basker et al. ............ 257/621 |
| 2012/0058605 | A1 * | 3/2012 | Fujii ............ 438/118 |
| 2012/0142185 | A1 * | 6/2012 | Park et al. ............ 438/667 |
| 2012/0315753 | A1 * | 12/2012 | Farooq et al. ............ 438/653 |

* cited by examiner

*Primary Examiner* — Minh-Loan Tran
*Assistant Examiner* — Shaka White
(74) *Attorney, Agent, or Firm* — L. Jeffrey Kelly; Steven Meyers

(57) ABSTRACT

According to one embodiment of the present invention, a method of plating a TSV hole in a substrate is provided. The TSV hole may include an open end terminating at a conductive pad, a stack of wiring levels, and a plurality of chip interconnects. The method of plating a TSV may include attaching a handler to the plurality of chip interconnects, the handler having a conductive layer in electrical contact with the plurality of chip interconnects; exposing a closed end of the TSV hole, including the conductive pad, to an electrolyte solution; and applying an electrical potential along an electrical path from the conductive layer to the conductive pad causing conductive material from the electrolyte solution to deposit on the conductive pad and within the TSV hole, the electrical path including the conductive layer, the plurality of chip interconnects, the stack of wiring levels and the conductive pad.

9 Claims, 13 Drawing Sheets

BOTTOM-UP PLATING OF THROUGH-SUBSTRATE VIAS

BACKGROUND a. Field of the Invention

The present invention generally relates to integrated circuits, and particularly to though-substrate vias for three-dimensional (3D) integrated circuits.

b. Description of Related Art

Advancements in the area of semiconductor fabrication have enabled the manufacturing of integrated circuits that have a high density of electronic components. A challenge arises where an increase in the number and length of interconnect wirings can cause an increase in circuit resistance-capacitance (RC) delay and power consumption, which can negatively impact circuit performance. Three-dimensional (3D) stacking of integrated circuits can address these challenges. Fabrication of 3D integrated circuits includes at least two silicon wafers stacked vertically. Vertically stacked wafers can reduce interconnect wiring length and increase device density. Deep through-substrate vias (TSVs) are formed to provide interconnections and electrical connectivity between the electronic components of the vertically stacked wafers. Such TSVs may require high aspect ratios, where the via height is large with respect to the via width, to save valuable area on the substrate. Therefore by using TSVs device density can be increased while reducing the total length of interconnection wiring.

However, fabrication techniques such as chemical vapor deposition (CVD) are unable to fill high aspect ratio TSV holes without the risk of pinch-off. Pinch-off refers to build up of deposited material at an opening of a trench or a via hole (e.g., TSV hole). This is a result of the width of a trench or the circumference of a via hole filling twice as fast as their depths. The occurrence of pinch-off may result in the formation of voids, where some volume of a trench or via hole remains unfilled with the deposited material. Void formation can result in an open circuit and if large enough may sever the interconnect structure. Thus, void formation can reduce integrated circuit performance, decrease reliability of interconnects, cause sudden data loss, and reduce the useful life of semiconductor integrated circuit products. In addition, pinch-off can trap undesired process chemicals within a trench or a via hole (e.g., TSV hole).

An alternative technique for fabricating TSVs may include electroplating. Electroplating techniques require a cathode. Generally, the part to be plated can act as the cathode. The cathode can be connected to a negative terminal of an external power supply and thus must be electrically conductive. In order to electroplate a trench or via hole etched in a nonconductive material, a seed layer may be required to act as the cathode. For example, a copper film may be deposited using physical vapor deposition or other known deposition techniques to form the requisite cathode, or seed layer, in preparation for electroplating. When electroplating a trench or via hole an electrical potential is applied to the copper seed layer while the structure is exposed to an electrolyte solution where the desired plating material can plate out onto the cathode. However, the risk of pinch-off remains in via holes fabricated using an electroplating technique because like other deposition techniques the plated material deposits on the sidewalls of the via hole at the same rate it deposits on the bottom of the TSV hole resulting in the circumference of the TSV hole filling twice as fast as its depth.

Accordingly, current fabrication techniques for filling high aspect ratio TSV holes with a conductive material have risks and disadvantages. Despite achievements that have been made in 3D integrated circuit technology to increase device density and reduce the length of interconnection wiring, the challenge of fabricating and filling high aspect ratio TSVs without void formation and chemical entrapment continues to persist.

SUMMARY

According to one embodiment of the present invention, a method of plating a through-substrate via (TSV) hole in a substrate is provided. The TSV hole may include an open end terminating at a conductive pad, a stack of wiring levels superimposed to one another positioned on top of the conductive pads, and a plurality of chip interconnects configured on a top surface of an upper wiring level. The method of plating a TSV may include attaching a handler to the plurality of chip interconnects, the handler having a conductive layer in electrical contact with the plurality of chip interconnects; exposing a closed end of the TSV hole, including the conductive pad, to an electrolyte solution; and applying an electrical potential along an electrical path from the conductive layer to the conductive pad causing conductive material from the electrolyte solution to deposit on the conductive pad and within the TSV hole, the electrical path including the conductive layer, the plurality of chip interconnects, the stack of wiring levels and the conductive pad.

According to another embodiment of the present invention, a method of plating a through-substrate via (TSV) hole in a substrate is provided. The substrate may include an open end terminating at a conductive pad, a stack of wiring levels superimposed to one another positioned on top of the conductive pads, and a plurality of chip interconnects configured on a top surface of an upper wiring level. The method of plating a TSV may include attaching a conductive handler to the plurality of chip interconnects; exposing a closed end of the TSV hole, including the conductive pad, to an electrolyte solution; and applying an electrical potential along an electrical path from the conductive handler to the conductive pad causing conductive material from the electrolyte solution to deposit on the conductive pad and within the TSV hole, the electrical path including the conductive handler, the plurality of chip interconnects, the stack of wiring levels and the conductive pad.

According to another embodiment of the present invention, a temporary handler used for semiconductor fabrication is provided. The temporary handler may include a conductive layer and a plurality of temporary chip attachment pads in electrical connection with the conductive layer.

According to another embodiment of the present invention, a temporary handler used for semiconductor fabrication is provided. The temporary handler may include a plurality of temporary chip attachment pads. The temporary handler may also include a conducting material.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which:

FIG. 1A depicts the formation of a back-end-of-line (BEOL) wiring level and the deposition of a pattern layer.

FIG. 1N depicts the addition of a conductive material within the TSV holes using an electroplating technique.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This disclosure may, however, be embodied in many different forms and should not be construed as limited to the exemplary embodiment set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Figure 1A:
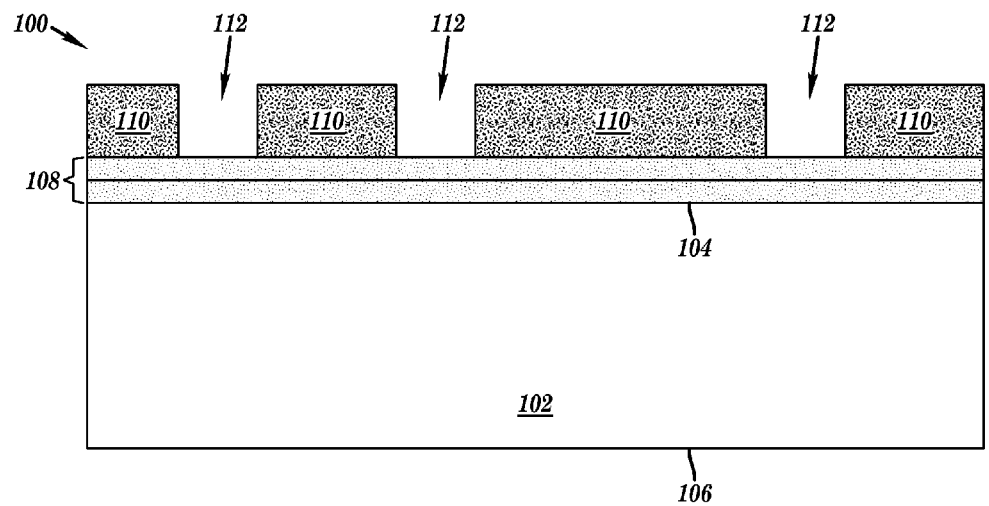
FIG. 1A-1N illustrates a method of bottom-up plating a TSV hole according to one exemplary embodiment.

FIG. 1A illustrates a cross-sectional view of a semiconductor 100 having a substrate 102. The substrate 102 includes a first surface 104 and a second surface 106. A first back-end-of-line (BEOL) wiring level 108 can be formed on the first-surface 104 of the substrate 102. Any combination of BEOL wiring levels and front-end-of-line (FEOL) levels may be present, but are not required. The BEOL wiring levels may be distinguished from FEOL levels in that semiconductor devices, for example transistors, may be fabricated in the FEOL levels while the connections between those devices may be formed in the BEOL wiring levels. The BEOL wiring levels are superimposed to one another where one BEOL wiring level is positioned on top of another BEOL wiring level. A pattern layer 110 can be deposited on the first BEOL wiring level 108. The pattern layer 110 may be, for example, a photoresist or a hardmask. One or more patterned openings 112 may be formed in the pattern layer 110 selective to the first BEOL wiring level 108 using a removal technique which may include, but is not limited to, dry etching, plasma etching, or reactive ion etching (RIE). The first BEOL wiring level 108 includes dielectric layers and metallization layers. The metallization layers provide electrical connections to semiconductor devices formed in the FEOL level on substrate 102. The patterned openings 112 are created to form TSV holes, including high aspect ratio TSV holes, in the semiconductor 100. A high aspect ratio TSV hole refers to a TSV hole having a height and a width, wherein the height is relatively large compared to the width. Thus, high aspect ratio TSV holes are tall and thin, and consume less substrate surface area. A high aspect ratio TSV hole may have a height 10 to 50 times larger than the width.

Figure 1B:
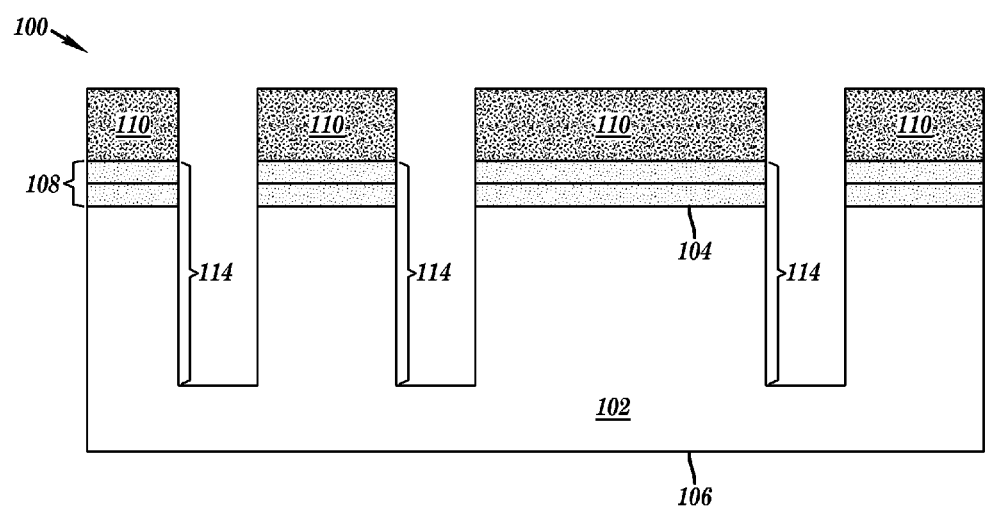
FIG. 1B depicts the formation of through-substrate via (TSV) holes.

FIG. 1B illustrates a cross-sectional view of the semiconductor 100 having one or more TSV holes 114 formed in the first BEOL wiring level 108 and in the substrate 102. For example, the TSV holes 114 may be formed in the first BEOL wiring level 108 and in the substrate 102 using a removal technique which may include, but is not limited to, RIE. For example, the TSV holes 114 can be created by performing an anisotropic RIE of the first BEOL wiring level 108 and the substrate 102. The pattern layer 110 may be removed after the TSV holes 114 are formed.

Figure 1C:
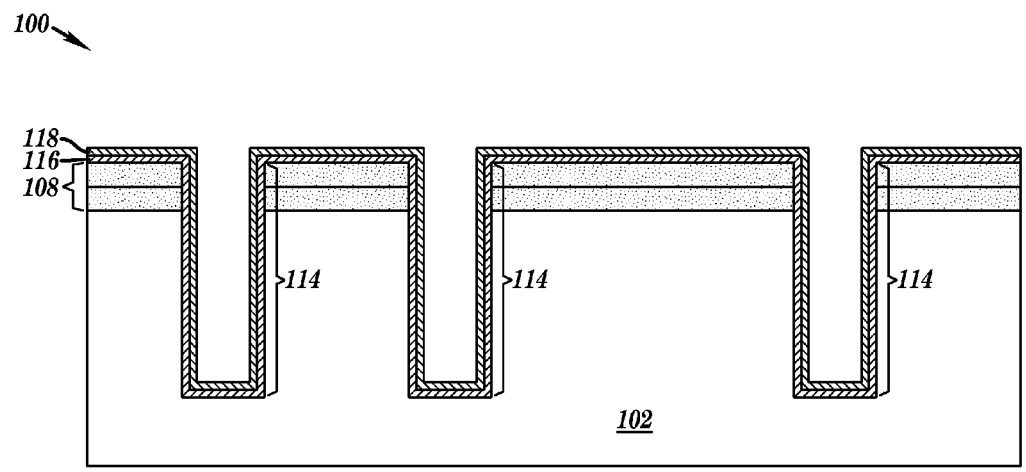
FIG. 1C depicts the removal of the pattern layer and the deposition of a dielectric layer and a diffusion barrier layer.

FIG. 1C illustrates a cross-sectional view of the semiconductor 100 having an optional first dielectric layer 116 deposited on and adjacent to the first BEOL wiring level 108 and the substrate 102. For example, the first dielectric layer 116 may include an oxide (e.g. silicon-oxide), nitride (e.g. silicon-nitride), polyimide, of a combination thereof. The first dielectric layer 116 can electrically isolate the substrate 102 from conductive material subsequently formed inside the TSV holes 114 to prevent short circuiting. The first dielectric layer 116 may be deposited on or adjacent to the first BEOL wiring level 108 and the substrate 102 using a CVD or other known deposition techniques. Chemical vapor deposition (CVD) can provide substantially uniform deposition of the first dielectric layer 116 adjacent to sidewalls and closed end of the TSV holes 114.

In addition, a diffusion barrier layer 118 may be deposited directly on or adjacent to the first dielectric layer 116, using a deposition technique that may include, but is not limited to, CVD, physical vapor deposition (PVD), or atomic layer deposition (ALD). Alternatively, the diffusion barrier layer 118 may be deposited directly adjacent to the first BEOL wiring level 108 and the substrate 102. For example, the diffusion barrier layer 118 may include tantalum, tantalum nitride, ruthenium, titanium, titanium nitride, or other materials capable of prohibiting conductive material (e.g., copper) from diffusing into the first dielectric layer 116 or the substrate 102. Diffusion of conductive material into the first dielectric layer 116 or the substrate 102 can result in degradation of the electrical characteristics of any semiconductor devices fabricated on the substrate.

Figure 1D:
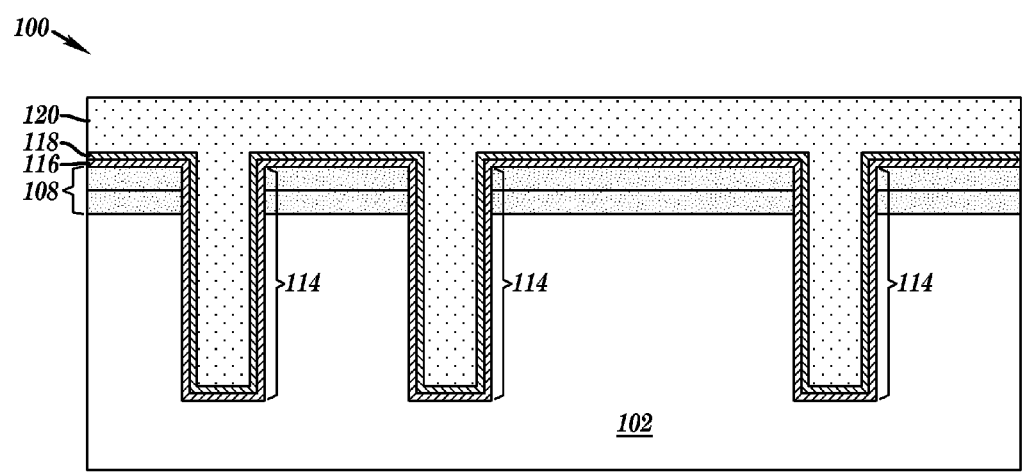
FIG. 1D depicts the deposition of a sacrificial material.

FIG. 1D illustrates a cross-sectional view of the semiconductor 100 having a sacrificial material 120 deposited directly adjacent to the diffusion barrier layer 118. For example, the sacrificial material 120 may include, but is not limited to, poly-silicon, polyimide, or an oxide. The sacrificial material 120 can be formed by using deposition a technique that may include, but is not limited to, CVD, PVD, or spin-on approaches. Using the sacrificial material 120 allows for additional semiconductor fabrication processes to be completed prior to filling the TSV holes 114 with a conductive material (e.g., copper). Since the sacrificial material 120 will be removed at a later step, the TSV holes 114 are not required to be filled completely with the sacrificial material 120.

Figure 1E:
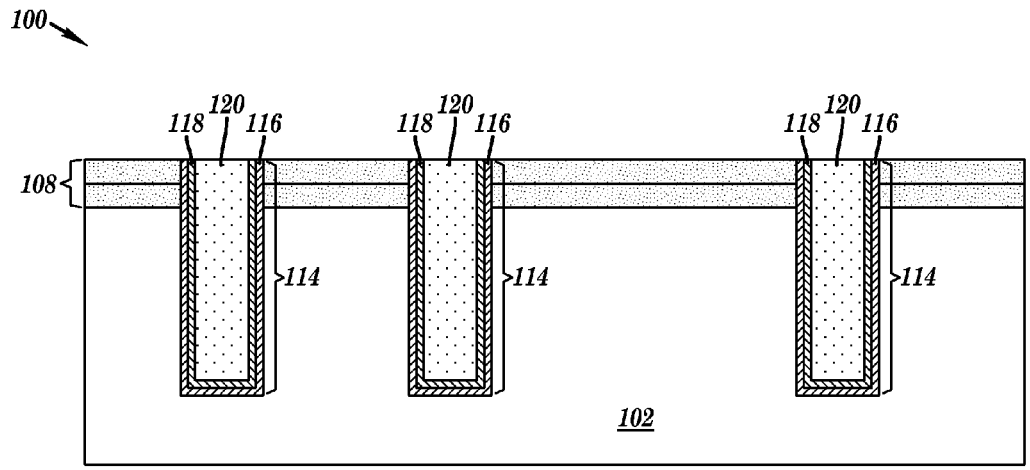
FIG. 1E depicts the removal of a portion of the sacrificial material using chemical mechanical planarization (CMP).

FIG. 1E illustrates the semiconductor 100 after a CMP technique was performed. The CMP technique removes the sacrificial material 120, the first dielectric layer 116, and the diffusion barrier layer 118 selective to the first BEOL wiring level 108. However, the first dielectric layer 116, the diffusion barrier layer 118, and the sacrificial material 120 remain in the TSV holes 114. Thus, the CMP technique provides a substantially flat surface for the formation of a quality interconnect structure, and permits the forming of additional BEOL wiring levels.

Figure 1F:
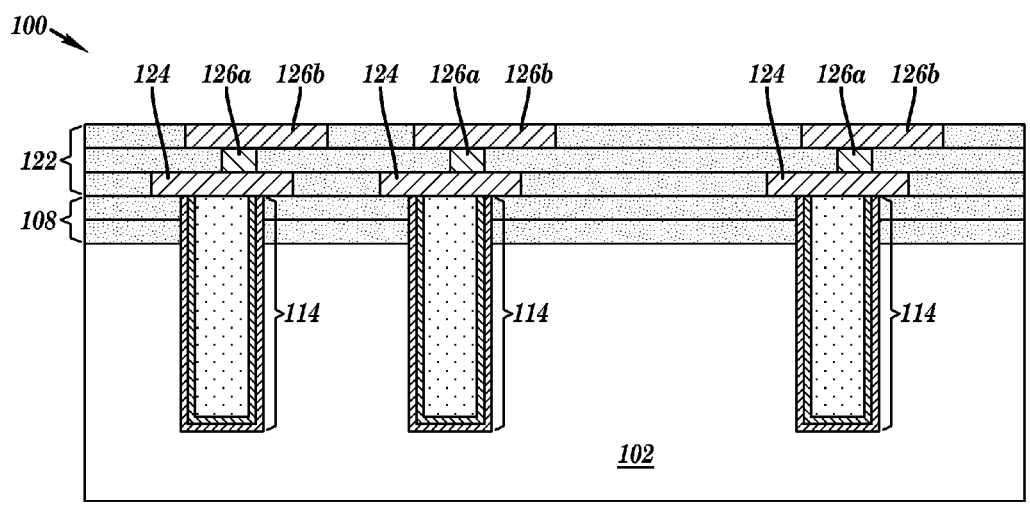
FIG. 1F depicts the addition of a second BEOL wiring level.

FIG. 1F illustrates a cross-sectional view of the semiconductor 100 after a second BEOL wiring level 122 was deposited on top of the first BEOL wiring level 108. The second BEOL wiring level 122 includes dielectric layers and metallization layers. The metallization layers provide electrical connections to semiconductor devices formed on the substrate 102. The metallization layers include one or more conductive pads 124, one or more metal wiring layers 126a, and one or more metal wiring layers 126b. For example, the conductive pads 124 may include copper, but the metal wiring layers 126a and 126b may be formed using other conductive materials, such as tungsten or aluminum. Specifically, the conductive pads 124 are formed on top of and covering the open end of the TSV holes 114. The conductive pads 124 may include, for example, a diffusion barrier layer to isolate the conductive pads 124 and eliminate a pathway for undesired diffusion or migration of conductive pad material into surrounding dielectric material in the BEOL wiring levels 108 and 122. For example, the diffusion barrier layer 118 may include tantalum, tantalum nitride, ruthenium, titanium, titanium nitride, or other materials that are capable of prohibiting conductive material (e.g., copper) from diffusing into the surrounding dielectric or the substrate 102.

Figure 1G:
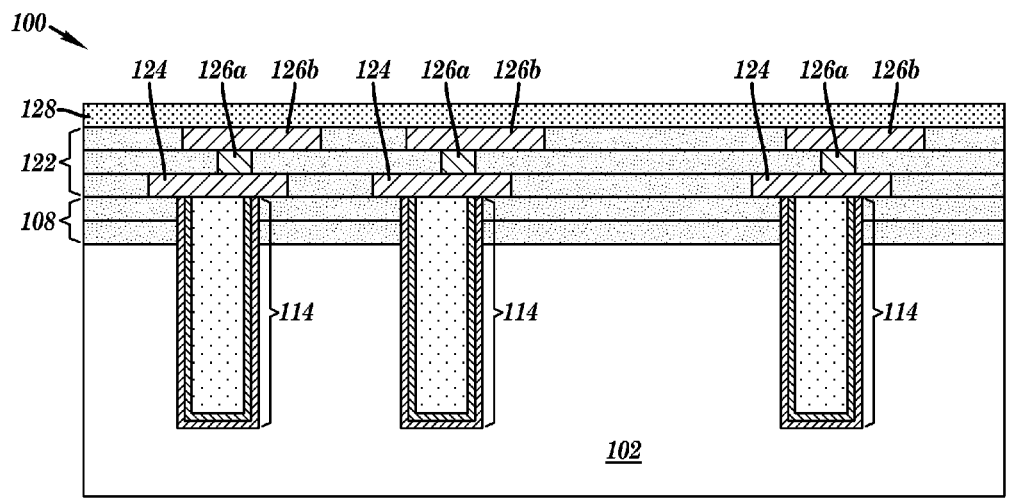
FIG. 1G depicts the deposition of a photosensitive polyimide (PSPI) layer.

FIG. 1G illustrates a cross-sectional view of the semiconductor 100, having a photosensitive polyimide (PSPI) 128 deposited on the second BEOL wiring level 122. For example, the thickness of the PSPI layer 128 may be about 1-10 µm. The PSPI layer 128 can be one example of an insulating dielectric that may be used, however other insulating dielectric materials, such as an oxide, may be used in place of the PSPI layer.

Figure 1H:
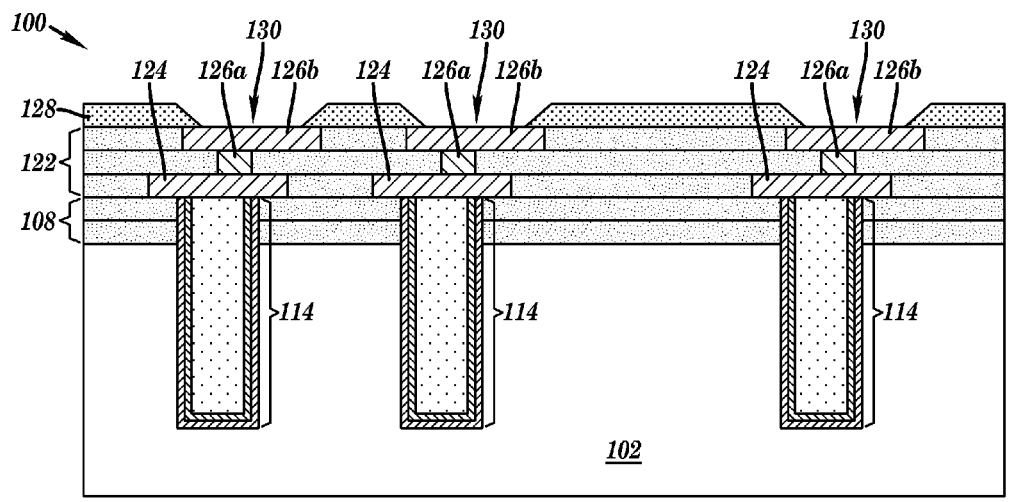
FIG. 1H depicts the formation of voids in the PSPI layer.

FIG. 1H illustrates a cross-sectional view of the semiconductor 100 having one or more openings 130 formed in the PSPI layer 128 by using a masking pattern and a removal technique or other known lithography techniques.

Figure 1I:
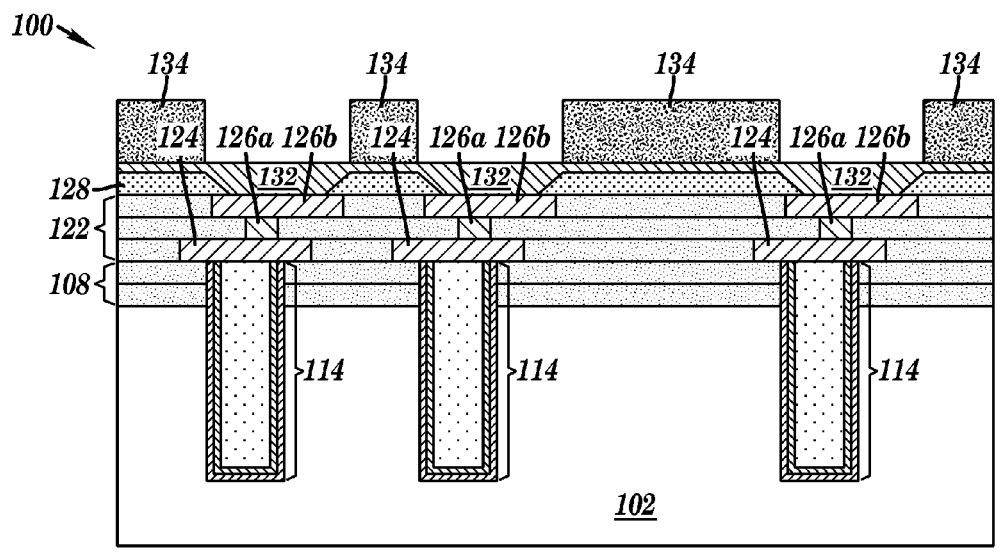
FIG. 1I depicts the deposition of an under bump metallurgy (UBM) layer and a resist mask layer.

FIG. 1I illustrates a cross-sectional view of the semiconductor 100, having an under bump metallurgy (UBM) layer 132 formed on the PSPI layer 128, and adjacent to the openings 130 (shown in FIG. 1H). For example, the UBM layer 132 may be formed by first depositing a seed layer using PVD or other known deposition techniques such as CVD, ALD, or other. The seed layer can be formed on the PSPI layer 128 and in the openings 130. The seed layer may include, for example, ruthenium, copper, or other materials known to facilitate copper plating from their surface. A resist mask 134 can be patterned on the seed layer to define the final shape of the UBM layer 132. Subsequently, standard electroplating techniques may be performed to create the UBM layer 132. The UBM layer 132 may include, for example, tin, silver, copper, nickel, chromium, or other materials known to facilitate a metallic or inter-metallic electro-mechanical connection between a handler and the substrate.

Figure 1J:
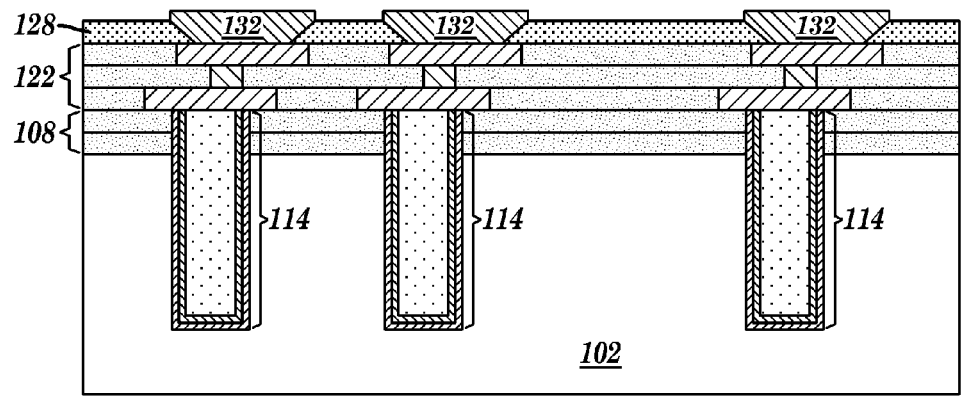
FIG. 1J depicts the final shape of the UBM layer after a resist mask is removed.

FIG. 1J illustrates the final shape of the UBM layer 132 after the resist mask 134 is removed and a maskless etch can be used to remove the remaining seed layer which was previously under the resist mask 134. The shape of the UBM layer 132 may vary and may not be flat on top as shown in FIG. 1J. For example, the UBM layer 132 may be concave on top with a hollow area in the middle. These various shapes of the UBM layer 132 do not fundamentally change the nature of how it is used in this instance. An electrical path can be formed from the UBM layer 132 through the metallization layers of the second BEOL wiring level 122 and the first BEOL wiring level 108 to the contact pads 124. For example, this electrical path can be used to perform an electroplating technique used to fill the TSV holes 114 with a conductive material.

Figure 1K:
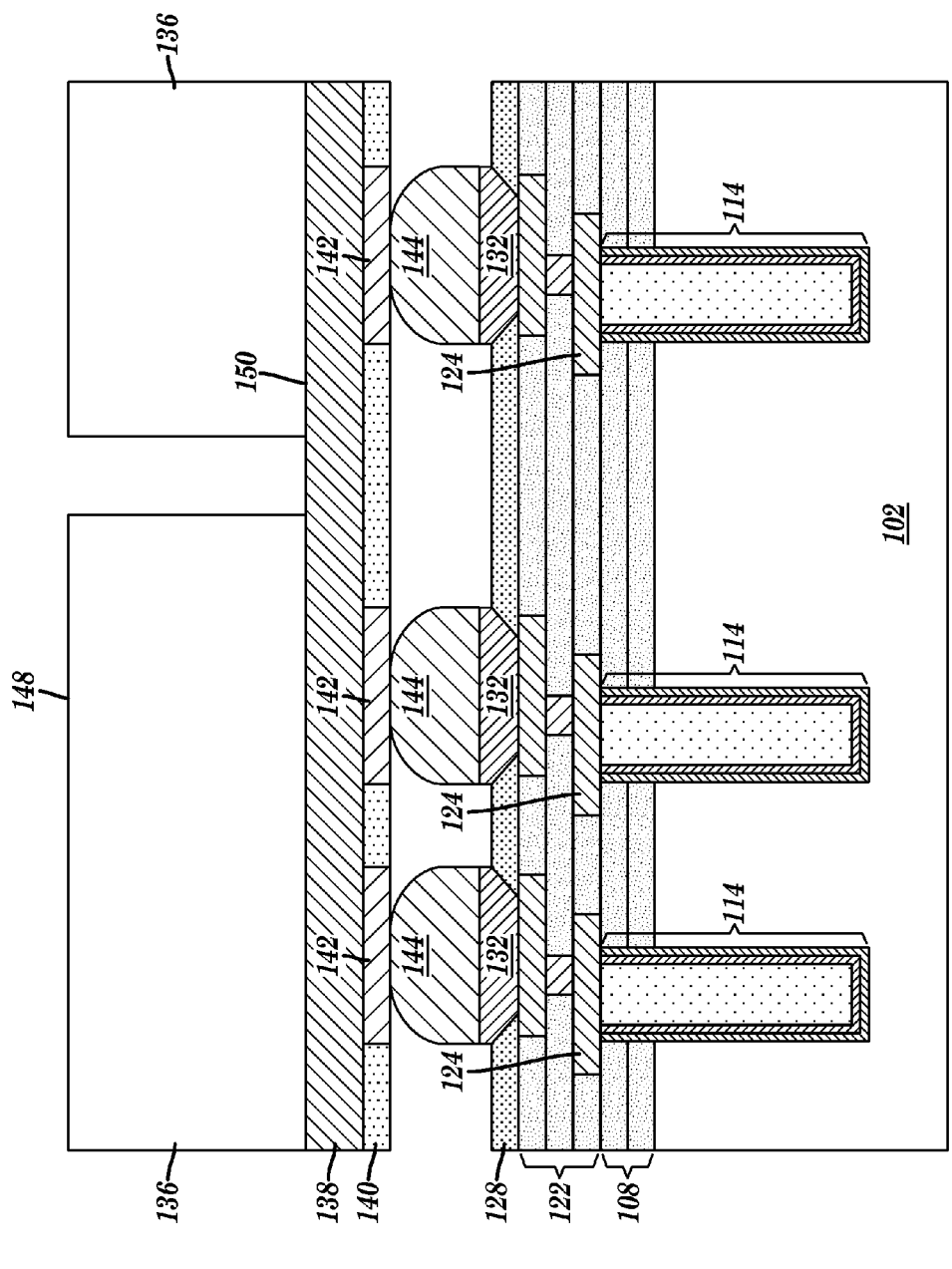
FIG. 1K depicts a handler attached to the semiconductor.

FIG. 1K illustrates a cross-sectional view of the semiconductor 100 having a handler 136 used to provide structural support to the substrate 102 during subsequent semiconductor fabrication processing. For example, the handler 136 may include glass or silicon and may be about 700-800 µm thick. A conductive layer 138 may be formed adjacent to a bottom surface 150 of the handler 136. The conductive layer 138 may include, for example, tin, silver, or copper; or an oxide that can be reduce by wet or dry flux.

The conductive layer 138 may also include, for example, a transparent conductive material such as indium tin oxide. Indium tin oxide (ITO, or tin-doped indium oxide) can be a solid solution of indium(III) oxide ($In_2O_3$) and tin(IV) oxide ($SnO_2$), typically 90% $In_2O_3$, 10% $SnO_2$ by weight. Indium tin oxide is a widely used transparent conducting oxide primarily because of two chief properties, its electrical conductivity and optical transparency, as well as the ease with which it can be deposited as a thin film. The transparency of this conductive layer is advantageous because it allows the observation of the surface of the substrate 102 through the handler 136 during subsequent processing operations. Enabling the capability of observing the surface of the substrate 102 through the handler 136 can improve alignment between the handler 136 and the substrate 102, and may allow for the detection of the causal nature of defects. A transparent conductive material may be designed to permit observation through it and with the use of proper illumination the transparency may be enhanced such that the transparent layer does not reflect light but transmits it to a desired observation point. For example, proper illumination may illuminate a surface positioned behind the transparent layer and transmit the image of that surface through the transparent layer to an observation point in front of the transparent layer. Alternatively, compounds such as indium silicon oxide, or aluminum zirconium oxide may be used as the transparent conductive layer. Metal films designed to be optically transparent to the frequency of the chosen analysis light may also be used.

The handler may also include one or more temporary chip attachment (TCA) pads 142 formed on and in electrical contact with the conductive layer 138. The TCA pads 142 may include, for example, tin, silver, copper, nickel, or chromium. An optional insulating layer 140 may be formed adjacent to the conductive layer 138 and may surround the TCA pads 142. The insulating layer 140 may include, for example, an oxide (e.g. silicon-oxide), nitride (e.g. silicon-nitride), polyimide, of a combination thereof. The TCA pads 142 and the UBM layer 132 are depicted as the same size for illustration purposes only. The TCA pads 142 may be smaller with respect to the UBM layer 132.

The handler 136 can be joined to the semiconductor 100 using a plurality of chip interconnects. These chip interconnects must mechanically join the semiconductor 100 with the handler 136 while also providing electrical connectivity between the semiconductor 100 and the handler 136. Multiple controlled collapse chip connections (C4s) are shown in FIG. 1K. The C4s include the UBM layer 132, a temporary solder contact 144, and the TCA pads 142 where the temporary solder contact 144 is fixed to both the UBM layer 132 and the TCA pads 142. The C4s provide mechanical support to the semiconductor 100 needed for subsequent fabrication techniques. Also, the C4s complete an electrical path between the conductive layer 138 of the handler 136 and the conductive pads 124 of the semiconductor 100. Alternatively, the handler 136 may be joined to the semiconductor 100 using copper pillar solder bumps (CPBs), or any combination of C4s and CPBs.

Figure 1L:
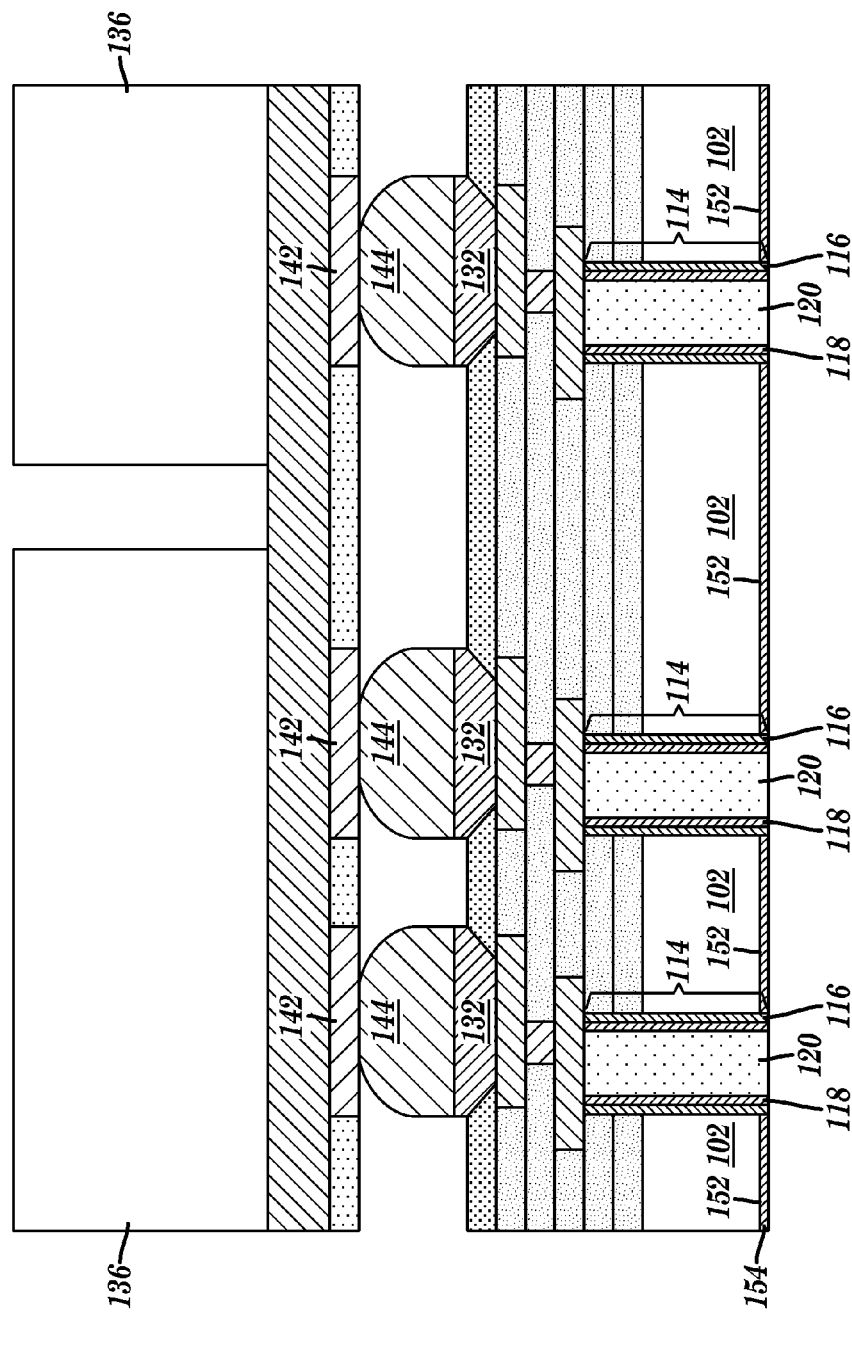
FIG. 1L depicts the application of another CMP technique to further expose the TSV holes.

FIG. 1L illustrates the end result after of a CMP technique is performed on the semiconductor 100. This CMP technique produces a flat surface and exposes the closed end of the TSV holes 114 and the sacrificial material 120 contained within the TSV holes 114. Once the closed end of the TSV holes 114 is exposed the conductive pads 124 may define the bottom of the TSV holes 114, and the previously closed end, now exposed, may define the top of the TSV holes 114. The CMP technique can reduce the height of the TSV holes 114. A second dielectric layer 154 may be deposited either before or after exposing the closed end of the TSV holes 114.

Figure 1M:
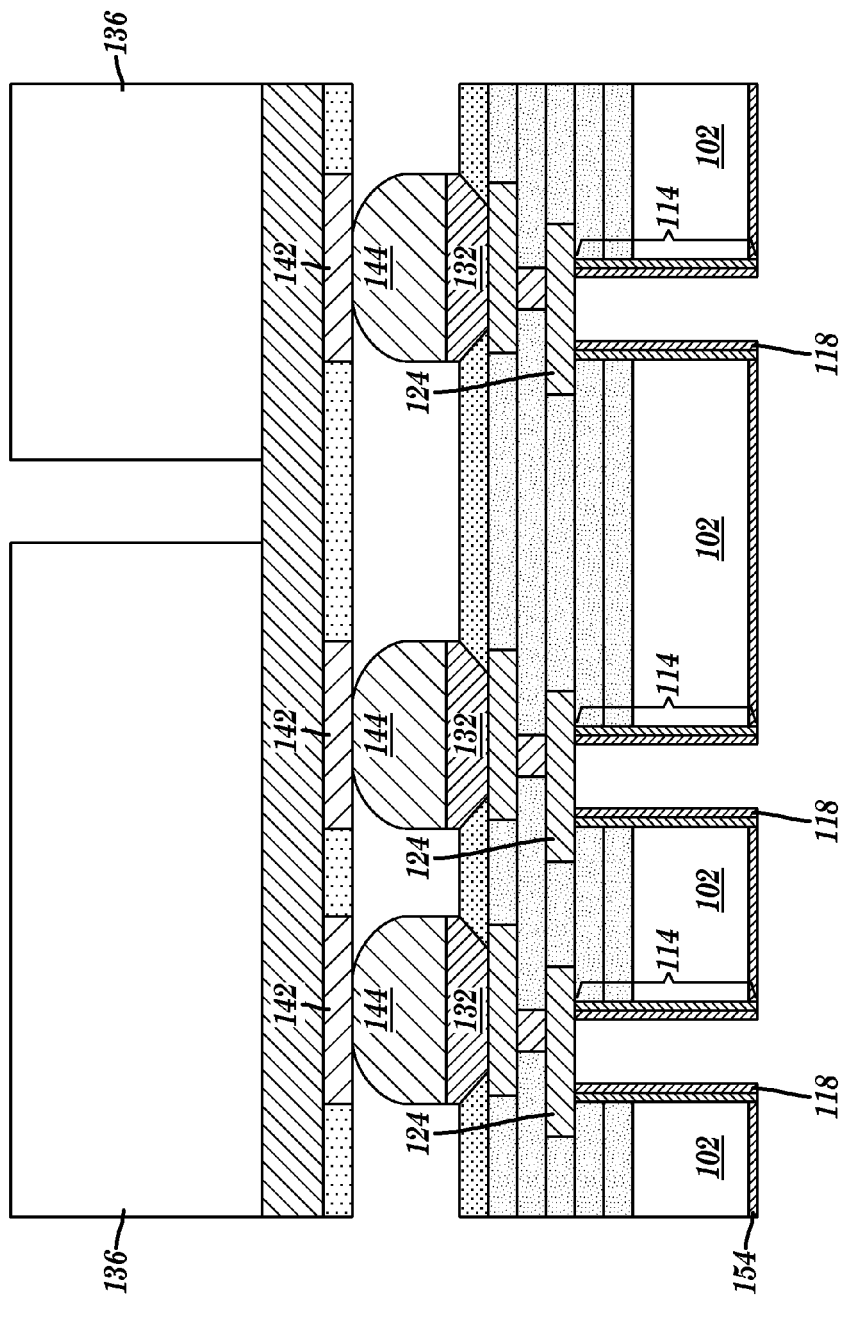
FIG. 1M depicts the removal of the sacrificial material from within the TSV holes.

FIG. 1M illustrates the end result after removal of the sacrificial material 120 (shown in FIG. 1M) from within the TSV holes 114 selective to the conductive pads 124 and the diffusion barrier layer 118. For example, wet etching or reactive ion etching (RIE), such as anisotropic RIE, can be used to remove the sacrificial material 120 (shown in FIG. 1M) from the TSV holes 114. In the process of removing the sacrificial material 120, anisotropic RIE may be used to expose the copper of the first contact pads 124 adjacent to the TSV holes 114.

Figure 1N:
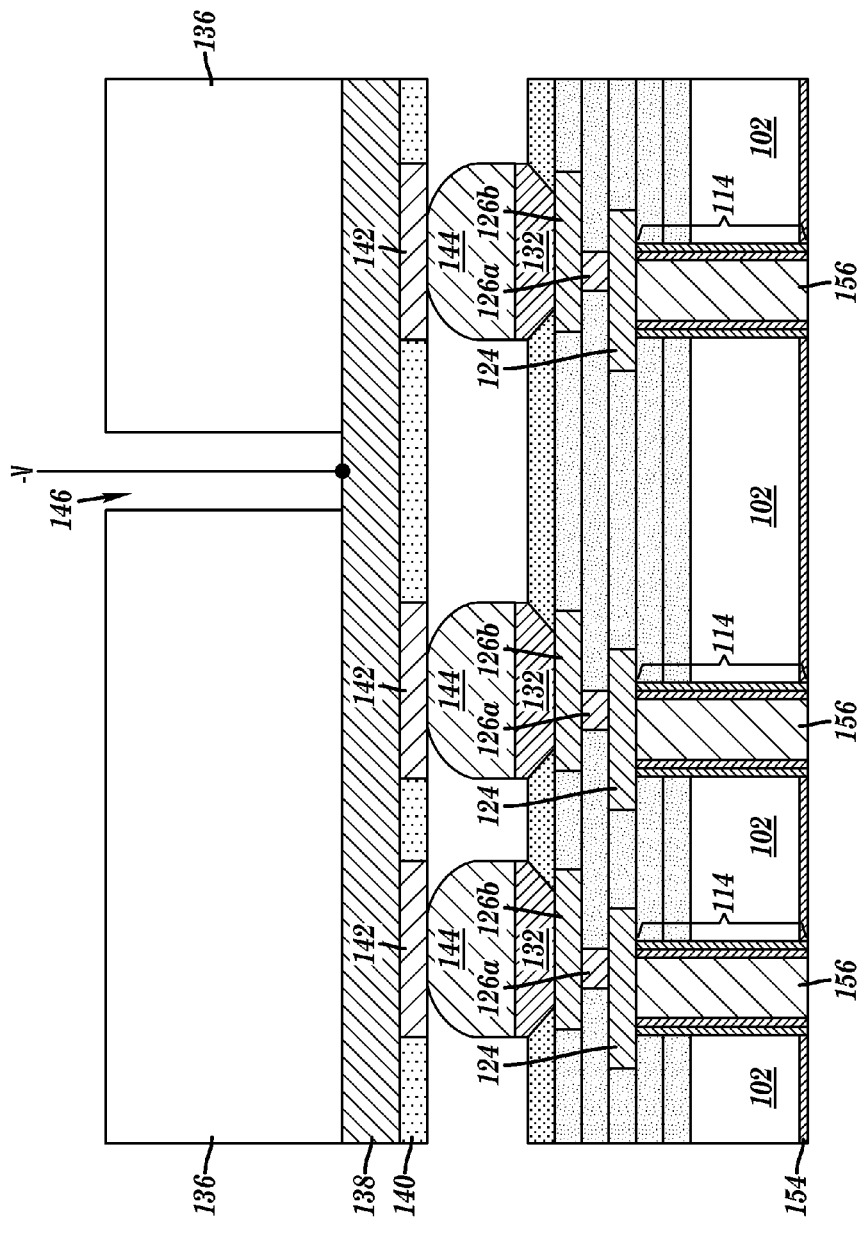

FIG. 1N illustrates a cross-sectional view of the semiconductor 100 after performing an electroplating technique to fill the TSV holes 114 with a conductive material 156 (e.g., copper) deposited on the conductive pads 124 from an electrolyte solution. This technique may be referred to as bottom-up plating because the TSV holes 114 are plated from the conductive pads 124 located at the bottom of the TSV 114 holes to the top opening of the TSV holes 114. The conductive pads 124 act as cathodes during the electroplating technique. For example, a negative voltage can be applied through an opening 146 in the handler 136. Specifically, the negative voltage can be applied to the conductive layer 138, which is part of an electrical path that further includes the TCA pads 142, the temporary solder contacts 144, the UBM layer 132, the metal wiring layers 126a and 126b and the conductive pads 124. Thus, during the electroplating technique electrical current flows through the electrical path to the conductive pads 124. While performing the electroplating technique, the conductive pads 124 are in contact with an electrolyte solution upon which the conductive material 156 (e.g., copper) from the electrolyte solution deposits on the conductive pads 124 and fills the TSV holes 114 from the bottom up. The electrolyte solution may include, but is not limited to, copper sulfate ($CuSO_4$) or sulfuric acid ($H_2SO_4$). The electroplating technique may be performed until the conductive material 156 (e.g., copper) from the electrolyte solution overfills and extends outside of the top opening of the TSV holes 114. A CMP technique may be used to remove any excess conductive material beyond the surface of the second dielectric layer 154. Once filled with the conductive material the TSV holes 114 may be referred to as through-substrate vias (TSVs).

Bottom-up plating of the TSV holes 114 reduces the risk of pinch-off or some volume of the via hole remaining unfilled with the plated material because plated material should not plate out, or grow, on the sidewalls of the TSV holes 114 during the described bottom-up plating technique. Bottom-up plating can provide for substantially even growth of the plated material from the conductive pads 124, allowing the TSV holes 114 to fill from the bottom only and not from both the sidewalls and bottom simultaneously. The bottom-up plating technique may also be applied to high aspect ratio TSV holes while continuing to substantially reduce the risk of pinch-off as described above.

Figure 2:
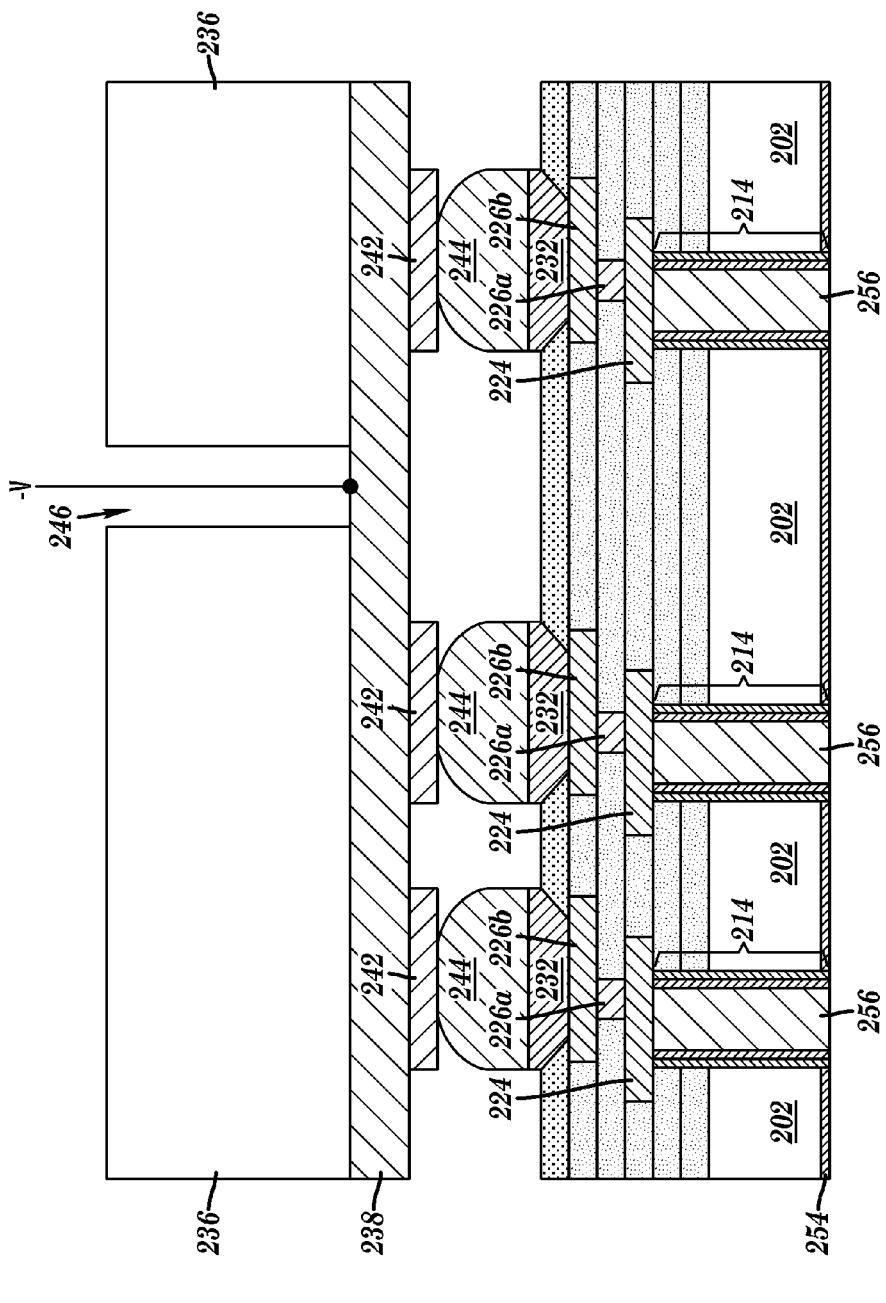
FIG. 2 is a cross-sectional view of a semiconductor structure according to another exemplary embodiment where the handler does not include an insulating layer.

FIG. 2 can be an alternative embodiment that illustrates a cross-sectional view of a semiconductor 200 having one or more TCA pads 242 not surrounded by an insulating layer (shown in FIG. 1N). The insulating layer shown in FIG. 1N may not be required if the conductive layer 238 is non-wetting to solder. For example, an electrical path can be formed from the conductive layer 238 through the TCA pads 242, the temporary solder contacts 244, the UBM layer 232, the metallization layers 226a and 226b and to the conductive pads 224. This electrical path provides the basis for a negative voltage use to fill the TSV holes 214 by an electroplating technique.

Figure 3:
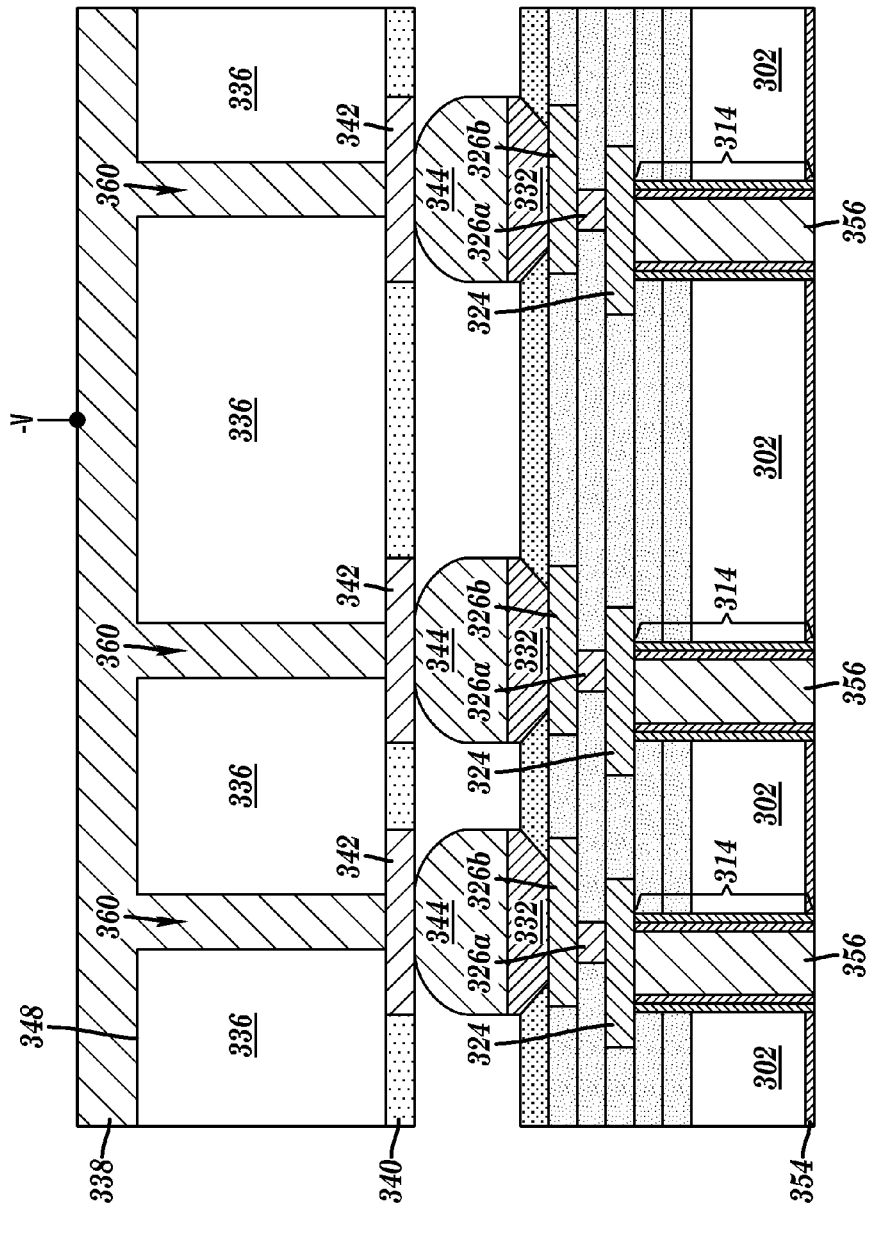
FIG. 3 is a cross-sectional view of a semiconductor structure according to another exemplary embodiment where a conductive layer is formed on the top of the handler and includes electrically conductive channels.

FIG. 3 illustrates an alternative embodiment wherein a semiconductor 300 has a conductive layer 338 deposited adjacent to a top surface 348 of the handler 336. The handler 336 is shown having one or more conductive channels 360 filled with a conductive material. The conductive channels 360 electrically connect the conductive layer 338 with the TCA pads 342. For example, an electrical path can be formed form the conductive layer 338 through the conductive channels 360, the TCA pads 342, the temporary solder contacts 344, the UBM layer 332, the metallization layers 326a and 326b, and to the conductive pads 324. This electrical path provides the basis for a negative voltage use to fill the TSV holes 314 by an electroplating technique.

Figure 4:
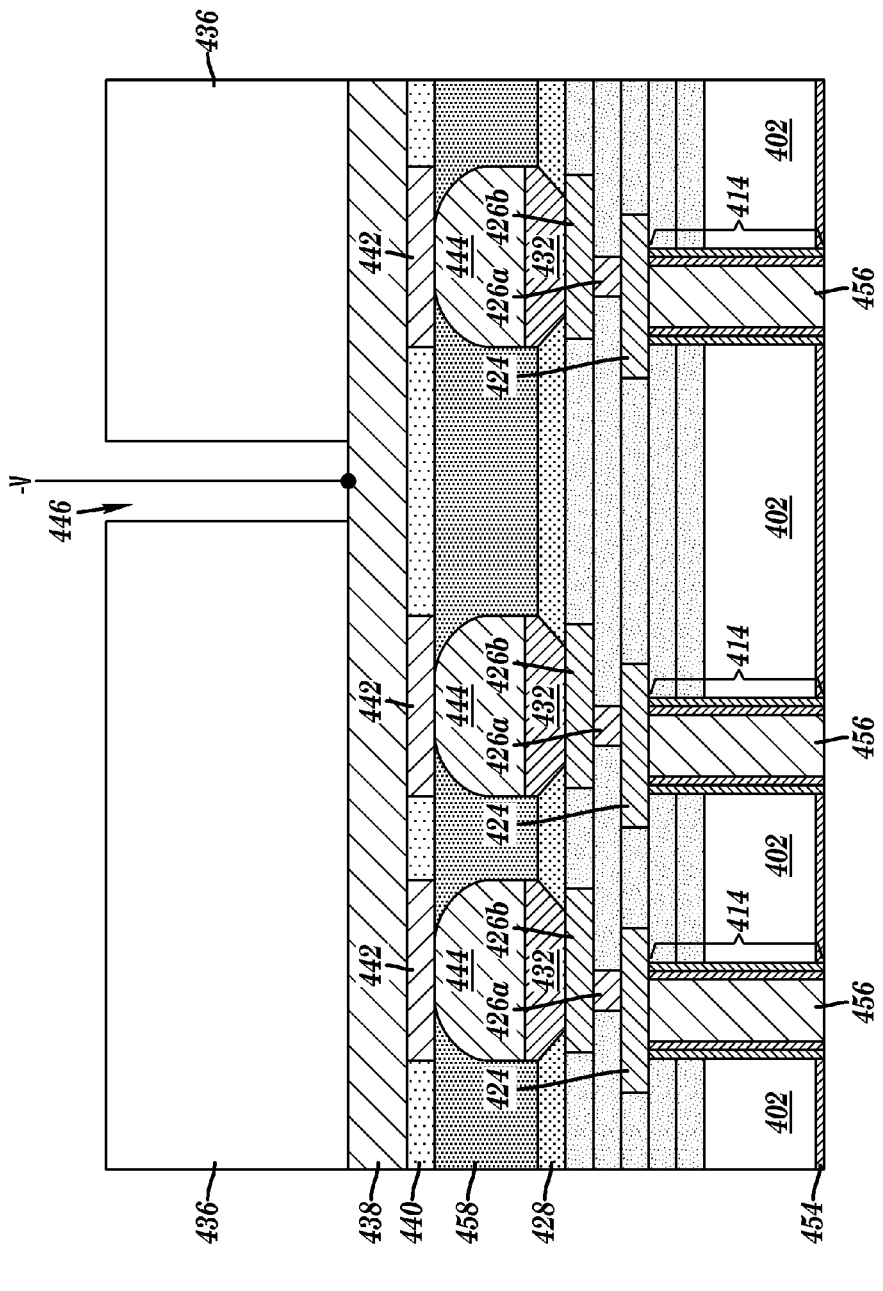
FIG. 4 is a cross-sectional view of a semiconductor structure according to another exemplary embodiment where an adhesive is used to add mechanical stability and rigidity to the connection between the handler and the substrate.

FIG. 4 illustrates another alternative embodiment wherein a semiconductor 400 has an adhesive layer 458 deposited between and adjacent to a dielectric layer 440 and a PSPI layer 428. The adhesive layer 458 is not required to join the handler 436 and the substrate 402, but may be provided for additional mechanical support and rigidity. For example, an electrical path can be formed form the conductive layer 438 through the TCA pads 442, the temporary solder contacts 444, the UBM layer 432, the metallization layers 426a and 426b, and to the conductive pads 424. This electrical path provides the basis for a negative voltage use to fill the TSV holes 414 by an electroplating technique.

Figure 5:
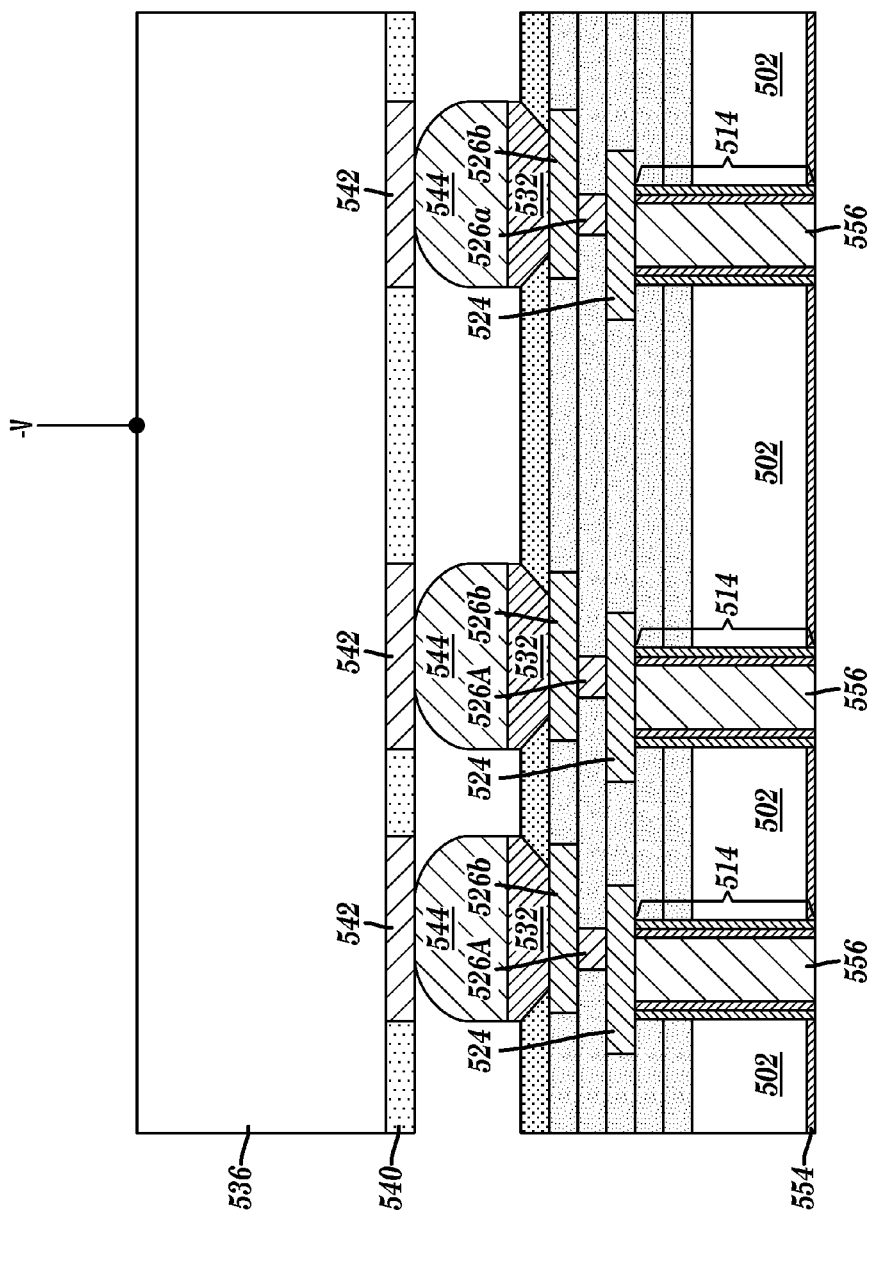
FIG. 5 is a cross-sectional view of a semiconductor structure according to another exemplary embodiment where the handler is conductive and no conductive layer is needed.

FIG. 5 illustrates another alternative embodiment wherein a semiconductor 500 has a conductive handler 536. For example, an electrical path can be formed form the conductive handler 536 through the TCA pads 542, the temporary solder contacts 544, the UBM layer 532, the metallization layers 526a and 526b, and to the conductive pads 524. This electrical path provides the basis for a negative voltage use to fill the TSV holes 514 by an electroplating technique.

After filling TSV holes with conductive material (e.g., copper) additional interconnect structures may be formed. The semiconductor may then be diced into individual chips while still attached to a handler. The chips may be joined to other chips or substrates. Subsequently, the handler may be removed.

Bottom-up plating a TSV hole may occur at many different stages of semiconductor fabrication. For example, a TSV hole may be plated prior to devices being formed on the substrate. They may also be plated after devices are formed on the substrate but prior to the formation of any BEOL wiring levels. TSV holes also may be plated after at least one BEOL wiring level but before the last BEOL wiring level is formed (as described above and depicted in FIG. 1A-1N). Lastly, a TSV hole may be plated after both FEOL processing and BEOL processing, and after the attachment of a handler and backside thinning using grind, CMP, or wet or dry etching.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of plating a through-substrate via (TSV) hole in a substrate, the TSV hole comprising an open end terminating at a conductive pad, a stack of wiring levels superimposed to one another positioned on top of the conductive pad, and a plurality of chip interconnects configured on a top surface of an upper wiring level, the method comprising:
   attaching a handler to the plurality of chip interconnects with a temporary solder contact, the handler comprising a conductive layer in electrical contact with the plurality of chip interconnects via the temporary solder contact;
   exposing a closed end of the TSV hole, including the conductive pad, to an electrolyte solution; and
   applying an electrical potential along an electrical path from the conductive layer to the conductive pad causing conductive material from the electrolyte solution to deposit on the conductive pad and within the TSV hole, the electrical path comprising the conductive layer, the plurality of chip interconnects, the stack of wiring levels and the conductive pad,
   wherein the conductive layer is formed on a top surface of the handler, further comprising forming one or more conductive channels extending from the conductive layer to a bottom surface of the handler.

2. The method of claim 1, further comprising:
   depositing a dielectric layer adjacent to a sidewall of the TSV hole.

3. The method of claim 2, further comprising:
   depositing a diffusion barrier layer on top of the dielectric layer.

4. The method of claim 1, further comprising:
   filling the TSV hole with a sacrificial material; and
   removing the sacrificial material selective to the conductive pad.

5. The method of claim 1, wherein the plurality of chip interconnects comprises a controlled collapse chip connection.

6. The method of claim 1, wherein the plurality of chip interconnects comprises a copper pillar solder bump.

7. The method of claim 1, wherein the conductive layer comprises a transparent conductive material.

8. The method of claim 1, wherein the handler comprises a temporary chip attachment pad positioned along a bottom surface of the handler, the electrical path further comprising the temporary chip attachment pad.

9. The method of claim 1, wherein the handler comprises a temporary chip attachment pad positioned along a bottom surface of the handler, the conductive channel extending from the conductive layer along the top surface of the handler to the temporary chip attachment pad, and the electrical path further comprising the conductive channel and the temporary chip attachment pad.

* * * * *